United States Patent
Subramanian et al.

(10) Patent No.: US 6,513,996 B1
(45) Date of Patent: Feb. 4, 2003

(54) INTEGRATED EQUIPMENT TO DRAIN WATER-HEXANE DEVELOPER FOR PATTERN COLLAPSE

(75) Inventors: Ramkumar Subramanian, San Jose, CA (US); Michael K. Templeton, Atherton, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/050,436

(22) Filed: Jan. 16, 2002

(51) Int. Cl.$^7$ .................................. G03B 5/00
(52) U.S. Cl. ............... 396/604; 396/611; 396/627; 118/52; 424/240
(58) Field of Search ................. 396/604, 611, 396/627; 118/52, 319–321, 666–668; 134/1, 3, 31, 34, 902; 427/240

(56) References Cited

U.S. PATENT DOCUMENTS

| | | | |
|---|---|---|---|
| 5,678,116 A | 10/1997 | Sugimoto et al. | 396/611 |
| 5,964,958 A | * 10/1999 | Ferrell et al. | 134/902 |
| 6,350,322 B1 | * 2/2002 | Yates | 134/31 |

OTHER PUBLICATIONS

Cae, Heidi, B., et al. "Comparison of Resist Collapse Properties for DUV and 193 nm Resist Platforms," EIPBN 2000 #141.

Domke, Wolf. D. "Pattern Collapse in High Aspect Ratio DUV—and 193nm Resists.".

* cited by examiner

Primary Examiner—D Rutledge
(74) Attorney, Agent, or Firm—Amin & Turocy, LLP

(57) ABSTRACT

One aspect of the present invention relates to a method and an apparatus for rinsing a substrate during a development process to mitigate pattern collapse. The apparatus includes a bath chamber; a substrate holder disposed in the bath chamber for holding the substrate having a resist pattern formed thereon; a first nozzle for dispensing a first rinsing solution having a first density and first surface tension into the bath chamber; a second nozzle for dispensing a second rinsing solution having a second density and second surface tension, which is less than the first rinsing solution, into the bath chamber; a drain disposed in a bottom portion of the bath chamber; and a controlling system operatively coupled to the first nozzle, the second nozzle and the drain designed to regulate and coordinate the operation of the first nozzle, the second nozzle and the drain.

20 Claims, 6 Drawing Sheets

INTEGRATED EQUIPMENT TO DRAIN WATER-HEXANE DEVELOPER FOR PATTERN COLLAPSE

TECHNICAL FIELD

The present invention generally relates to processing a semiconductor substrate. In particular, the present invention relates to a system and method of rinsing and draining a semiconductor substrate to mitigate pattern collapse.

BACKGROUND ART

In the semiconductor industry, there is a continuing trend toward higher device densities. To achieve these high densities there has been and continues to be efforts toward scaling down the device dimensions on semiconductor wafers (e.g., at submicron levels). In order to accomplish such high device packing density, smaller and smaller features sizes are required. This may include the width and spacing of interconnecting lines, spacing and diameter of contact holes and the surface geometry such as corners and edges of various features. However, although the pattern width is reduced, the height of the pattern cannot be reduced very much. Thus, the aspect ratio (height/width) of the pattern increases and the pattern easily collapses.

Such patterns are formed in high resolution photolithographic processes. In general, lithography refers to processes for pattern transfer between various media. It is a technique used for integrated circuit fabrication in which a silicon slice, the wafer, is coated uniformly with a radiation-sensitive film, the resist and an exposing source (such as optical light, x-rays, etc.) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

The developing process involves exposing the irradiated wafer to the developer solution and then rinsing the developer solution from the wafer. Because the wafer still contains moisture and/or solution droplets on it, the wafer must be dried so that the rinsing solution can evaporate from the surface. However, at some point during the development process, the resist pattern has a tendency to collapse. More specifically, pattern collapse often occurs during the drying process, particularly when the rinsing solution begins to evaporate from the wafer surface.

FIGS. 1–4 illustrate an example of pattern collapse during a photolithography process. A substrate 10 is shown with patterns 20 provided thereon. It is noted that the patterns 20 are greatly exaggerated for ease of illustration. In FIG. 1, the substrate 10 is shown completely immersed in a developer liquid 30, which is enclosed within a processing chamber 25. The collapse of resist patterns 20 is more likely to occur after the substrate 10 has been developed and rinsed. In particular, resist pattern deformity may occur when the rinsing solution 30 begins to evaporate 35, as shown in FIG. 2. According to FIG. 2, the surface tension of the developer solution 30 remains between the resist patterns 20, causing resist pattern deformity 40.

FIG. 3 shows the substrate 10 as it appears during the drying process. As the surface of the substrate 10 continues to the dry, adjacent resist patterns 40 may lean toward and eventually against each other. The collapsed patterns 40 adversely affect the substrate 10 (or any other underlying layer) when an etching process 50 is conducted in or on the substrate 10. The deformed pattern eventually results in a deformed and defective substrate 60 (FIG. 4), thereby destroying the structurally integrity of the semiconductor device.

Therefore, there is an unmet need for a process to mitigate the collapse of resist patterns during the drying stage of a photolithography process.

SUMMARY OF THE INVENTION

The present invention provides an apparatus and a method for mitigating pattern collapse in a semiconductor substrate during the drying stage of a photolithography process. More specifically, the present invention involves the addition of hexane to the rinsing solution, thereby leaving hexane instead of water on the surface of the developed wafer. By employing a water-hexane rinsing solution, the surface tension is reduced between the developer solution and the resist. As a result, pattern collapse can be prevented, providing a more efficient and economical semiconductor manufacturing process.

One aspect of the present invention provides a semiconductor processing apparatus for rinsing a developed wafer to mitigate pattern collapse. The apparatus includes a bath chamber; a substrate holder disposed in the bath chamber for holding a substrate having a resist pattern formed thereon; a first nozzle for dispensing a first rinsing solution having a first density and first surface tension into the bath chamber; a second nozzle for dispensing a second rinsing solution having a second density and second surface tension, which is less than the first rinsing solution, into the bath chamber; a drain disposed in a bottom portion of the bath chamber; and a controlling system operatively coupled to the first nozzle, the second nozzle and the drain designed to regulate and coordinate the operation of the first nozzle, the second nozzle and the drain.

Yet another aspect of the present invention provides a method for rinsing a substrate during development to mitigate pattern collapse. The method involves the steps providing the substrate having a resist pattern transferred thereon into a bath chamber; exposing the substrate to a developer solution; removing the developer solution from the chamber via a drain; introducing a first rinsing solution into the bath chamber concurrently with removing the developer solution so that the substrate is immersed in liquid at substantially all times; removing the first rinsing solution from the chamber via the drain; introducing a hexane solution into the bath chamber concurrently with removing the first rinsing solution so that the substrate is immersed in liquid at substantially all times; and removing the hexane solution via the drain in order to dry the substrate.

Still yet another aspect of the present invention provides a method for rinsing a substrate during development to mitigate pattern collapse. The method involves the steps of providing the substrate having a resist pattern transferred thereon into a bath chamber; exposing the substrate to a developer solution; removing the developer solution from the chamber via a drain; introducing a water solution into the bath chamber concurrently with removing the developer solution so that the substrate is immersed in liquid at substantially all times, wherein the water solution rinses the developer solution from the substrate; removing the water solution from the chamber via the drain; introducing a hexane solution into the bath chamber concurrently with removing the water solution so that the substrate is immersed in liquid at substantially all times, wherein the hexane solution facilitates a subsequent drying process; and removing the hexane solution via the drain in order to dry the substrate.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DISCLOSURE OF INVENTION

Figure 1:
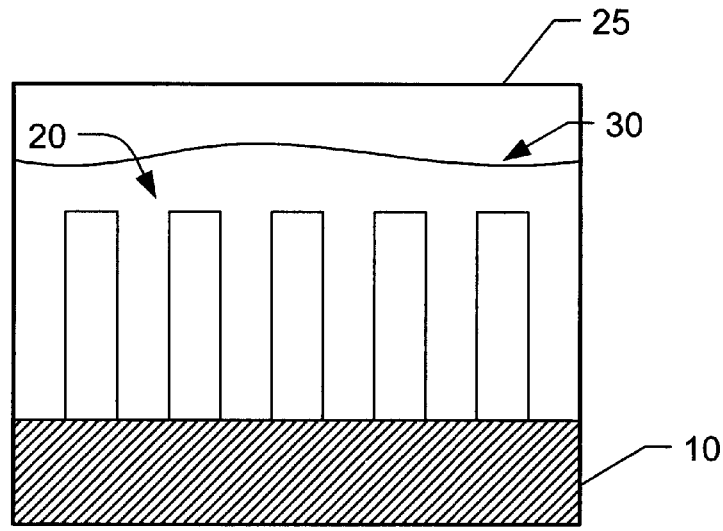
FIG. 1 illustrates a semiconductor structure having a resist pattern in accordance with the prior art.
Figure 2:
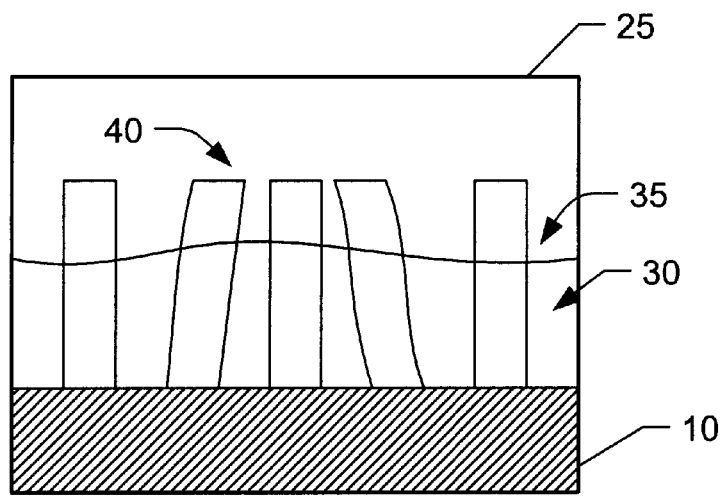
FIG. 2 illustrates the structure of FIG. 1 during a drying process in accordance with the prior art.
Figure 3:
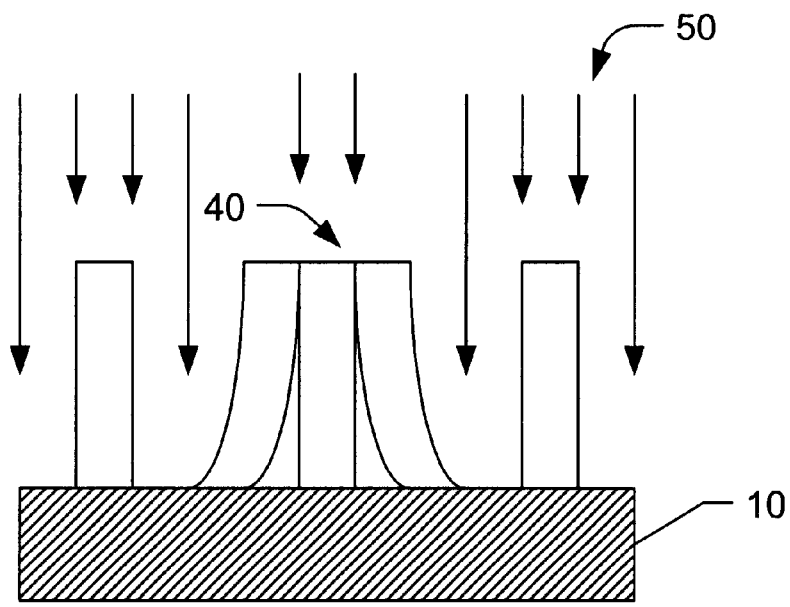
FIG. 3 illustrates the structure of FIG. 2 being employed in an etch process in accordance with the prior art.
Figure 4:
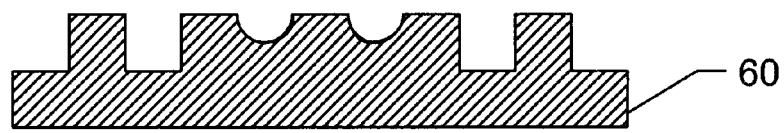
FIG. 4 illustrates the structure of FIG. 3 following completion of the etch process in accordance with the prior art.

The present invention involves an apparatus and a method for drying a developed wafer after it is rinsed. More specifically, the present invention provides a non-destructive method and apparatus for preparing a developed wafer to be dried in order to mitigate pattern collapse. One aspect of the present invention generally relates to using a water-hexane developer solution in the development process. In particular, the water-hexane developer solution may be employed to reduce the surface tension between the resist pattern and the developer solution, thus, reducing pattern collapse during the drying stage of the development process. As a result, improved pattern transfer fidelity may be obtained, thereby facilitating a decrease in product yield loss and an increase in overall product performance.

The apparatus and method employ a water-hexane rinsing solution during post-development processing. In particular, post-development processing involves a rinse process designed to wash the developer solution from the wafer. For the wafer to be properly developed, the wafer must be immersed in a liquid bath chamber at all times, including during the rinse stage. In the present invention, the liquid bath chamber is initially filled with the developer solution such that the wafer is completely immersed. The wafer is exposed to the developer solution for a specified amount of time sufficient to develop the wafer. Then a drain releases the developer solution from the bath chamber at a rate about equal to the rate water is introduced into the chamber. The water continues to enter the bath chamber until the developer solution is substantially removed from the chamber or until the wafer is sufficiently exposed to the water. The drain may continue to be open to ensure that substantially all of the developer solution has exited the chamber.

Once the wafer has been sufficiently exposed to the water to effect removal of the developer solution, the water may be replaced with hexane to facilitate drying the wafer. More specifically, the water is allowed to drain from the bath. At about the same rate the water drains from the bath, hexane is added to the bath such that the level of liquid is maintained in the bath chamber. Thus, the wafer is continuously immersed by any liquid at all times during the rinsing process.

Hexane is an organic liquid which is insoluble in water and water solvents. It is substantially non-destructive to semiconductor materials and has a lower surface tension than water. In addition, hexane dries more easily than water in air or by heat. In air, hexane reacts with oxygen and can then be broken down. Due to its easy drying ability and lower surface tension, hexane causes substantially less, if any, pattern collapse damage to wafers during the drying process or development process in general. Furthermore, hexane is less dense than water; thus, in a chamber filled with water and hexane, the hexane visibly rests above the water. Therefore, when hexane is added to the water-filled chamber in accordance with the present invention, it remains in the top portion of the chamber while the water remains in the bottom portion of the chamber. As the water continues to drain from the chamber, the hexane visibly covers the wafer. The heavier water droplets on the wafer are replaced by the lighter hexane droplets. Therefore, hexane—and not water—remains on the surface of the developed wafer following the rinse stage. The wafer may then be dried to remove the hexane droplets left on the wafer surface by air or by heat. Because hexane has a lower surface tension and easily dries more so than conventional rinsing solutions, pattern collapse is mitigated.

Moreover, the developed wafer is initially rinsed with water to remove the developer solution and then with hexane to facilitate the drying process. Hexane is not destructive to the physical or chemical integrity of the developed wafer. Therefore, the overall quality of the wafer is not substantially compromised by employing hexane during the rinsing process.

The present invention is to be described with reference to FIGS. 5–9 below, wherein like reference numerals are used to refer to like elements throughout. In the following description, for purposes of explanation, numerous specific details are set forth in order to provide a thorough understanding of the present invention. It may be evident, however, to one skilled in the art that the present invention may be practiced without these specific details. In other instances, well-known structures and devices are shown in block diagram form in order to facilitate description of the present invention.

Figure 5:
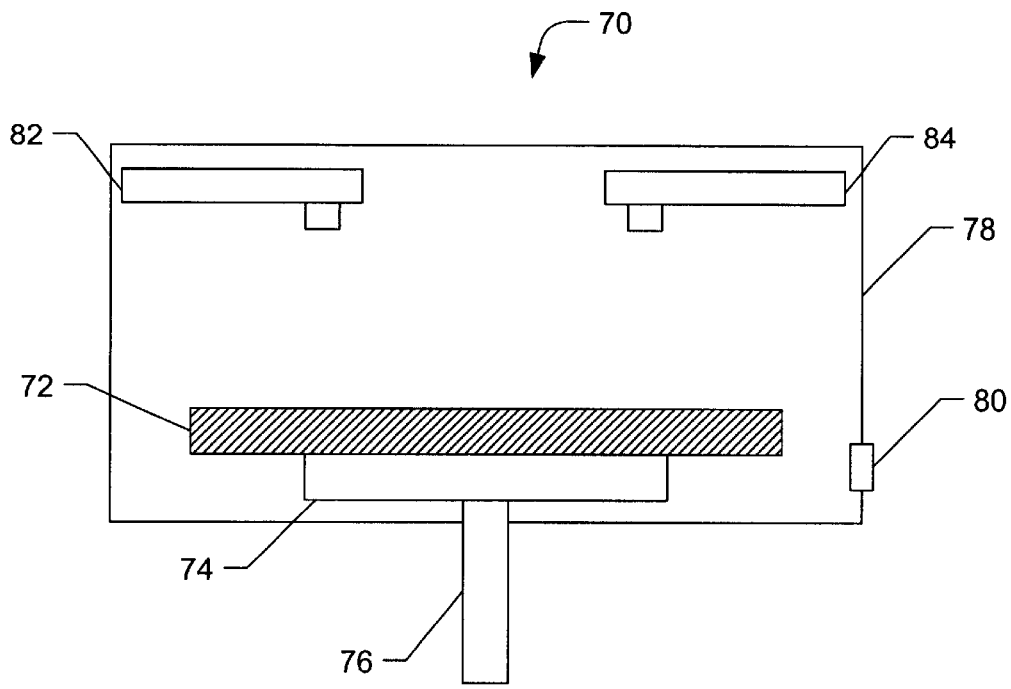
FIG. 5 illustrates a schematic diagram of an apparatus for rinsing and drying a developed wafer in accordance with one aspect of the present invention.
Figure 10:
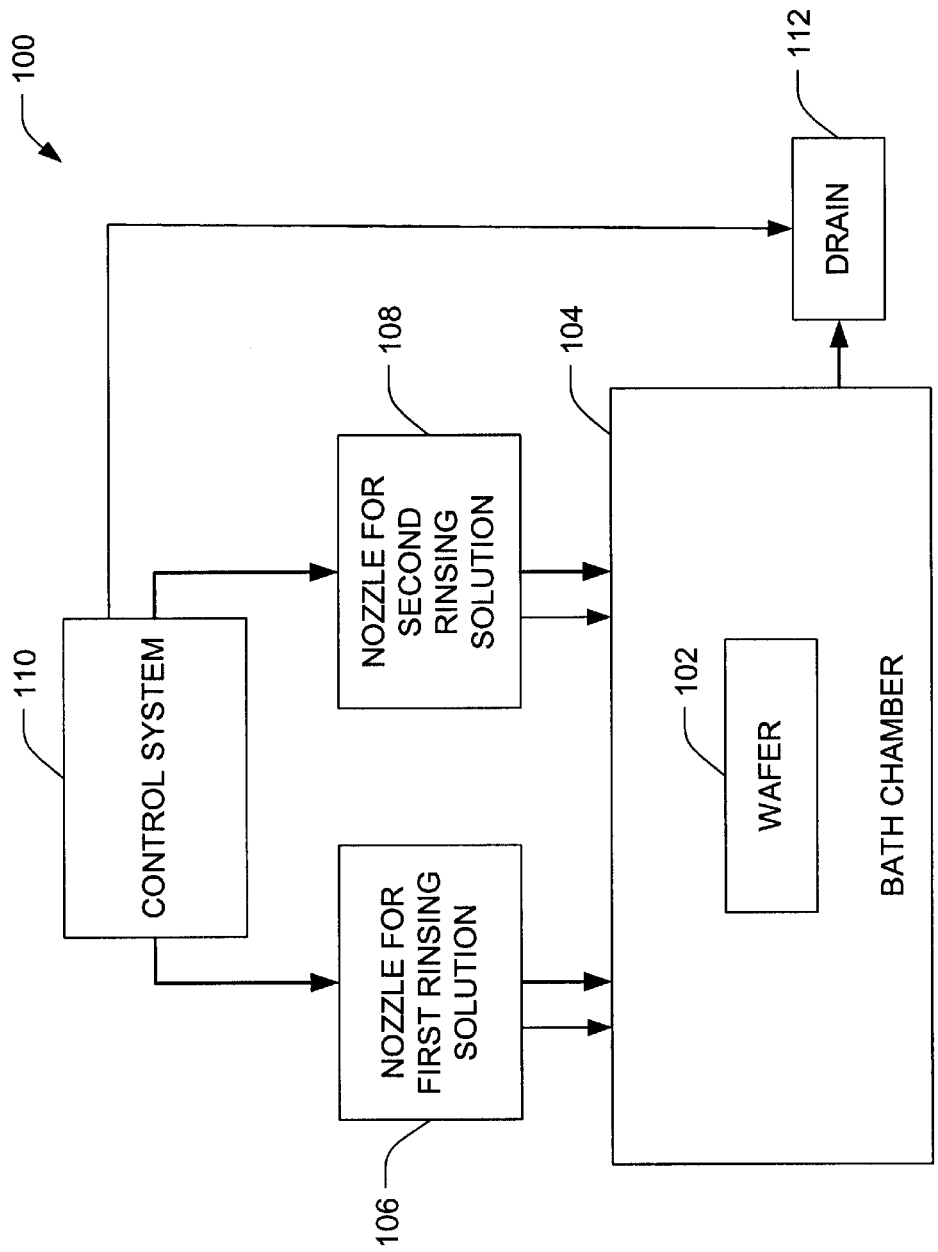
FIG. 10 illustrates a high level, schematic diagram of an apparatus in accordance with the present invention.

Referring initially to FIG. 5, a system 70 for rinsing a developed wafer is shown. The system 70 includes a resist-clad wafer 72 which is supported by a chuck 74. The chuck 74 is controlled by a positioning device 76, both of which are known in the art. The wafer 72 is enclosed in a liquid bath chamber 78. The liquid bath chamber includes a drain 80 but is otherwise sealed to prevent liquid from exiting the chamber. Operation of the drain and rate at which the liquid flows through may be manually or machine controlled (e.g., computer programmed). The liquid bath chamber 78 may also include two nozzles which provide water 82 and hexane 84 individually and separately to the bath chamber. The nozzles 82 and 84 may also be manually or machine controlled depending on the desired application and use such as by a controlling system (FIG. 10).

Figure 6:
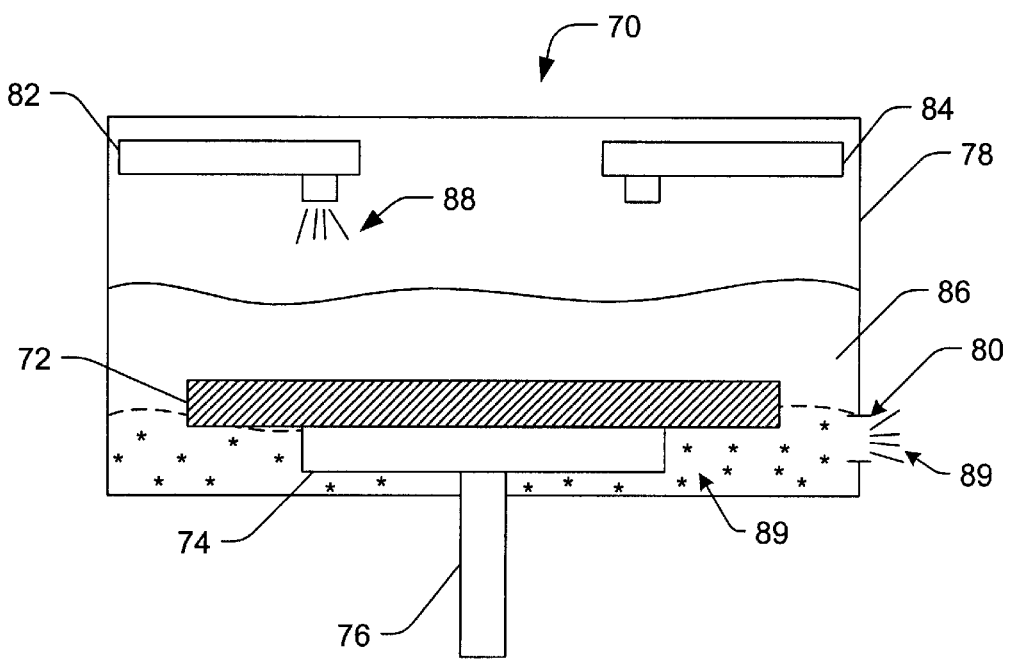
FIG. 6 illustrates the diagram of FIG. 5 being employed in a rinsing process in accordance with one aspect of the present invention.

FIG. 6 shows the liquid bath chamber 78 substantially filled with water 86 or a water based solution according to one aspect of the present invention. As a result, the wafer 72 is substantially immersed. The water has filled 88 the liquid bath chamber 78 in order to rinse developer solution 89 from the surface of the wafer 72. The drain 80 may be activated at a known time during the rinse process so as to slowly remove the water to make room for a second solution/liquid. However, it should be understood that the wafer 72 must be immersed in the water (or other liquid) until the drying process begins. Therefore, as soon as the drain 80 opens, a liquid (e.g., water or hexane) needs to be added at a substantially similar rate to keep the wafer 72 covered and to prevent the chamber from overflowing. It should be understood that the drain 80 may have been opened during development (i.e., exposure to developer solution) and may remain open through the rinse stage.

Figure 7:
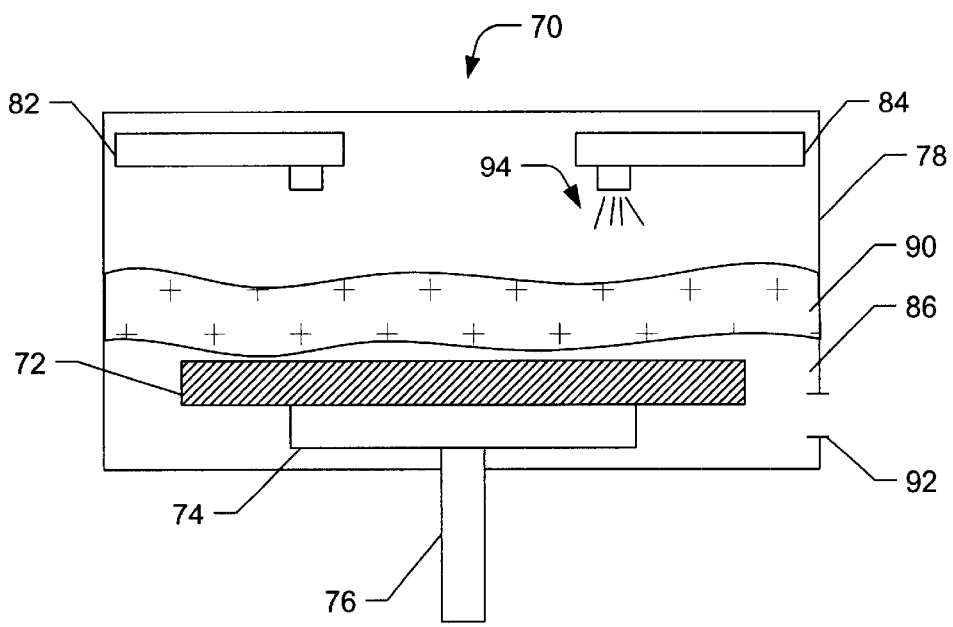
FIG. 7 illustrates the diagram of FIG. 5 being employed in a rinsing process in accordance with one aspect of the present invention.

In FIG. 7, a hexane layer 90 has formed atop the remaining water 86. More specifically, the water nozzle 82 has stopped releasing water and the drain 80 is open 92, allowing water to exit from the chamber 78 at a rate substantially equal to the rate at which the hexane 94 flows into the chamber 78. As is illustrated, the hexane layer 90 does not mix with the remaining water because hexane is insoluble in and less dense than water.

Figure 8:
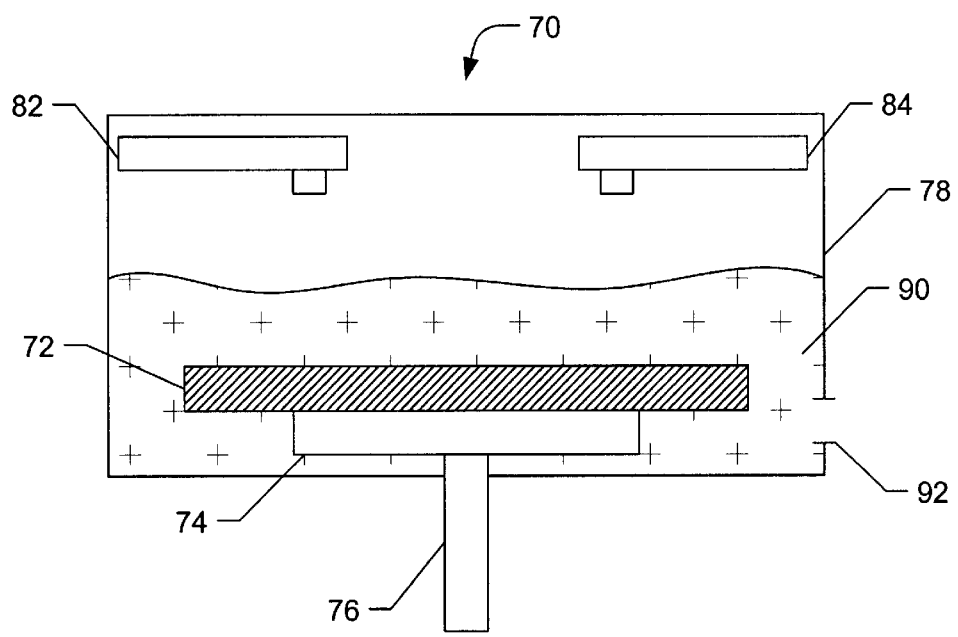
FIG. 8 illustrate diagram of FIG. 5 being employed in a rinsing process in accordance with one aspect of the present invention.

FIG. 8 shows the wafer 72 substantially immersed in hexane 90 (or a hexane solution containing hexane and other inert components). At this stage of the developing process, the developer solution has been substantially rinsed away. The drain 80 may remain open 92 so that the hexane 94 may later be removed from the bath chamber 78.

Figure 9:
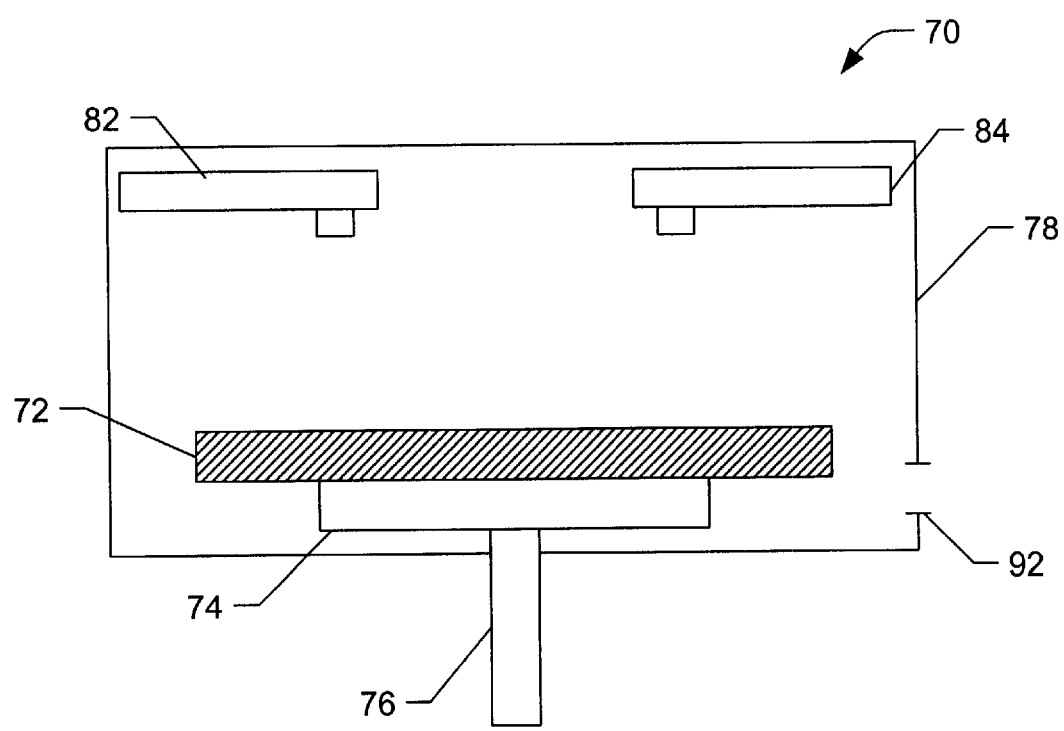
FIG. 9 illustrates the diagram of FIG. 5 after the rinsing process is substantially completed in accordance with one aspect of the present invention.

FIG. 9 illustrates the wafer 72 in the chamber 78 following substantial completion of the rinse process. The surface of the wafer 72 may include hexane droplets. That is, the hexane has substantially replaced the water on the surface of the wafer 72 in accordance with the present invention. The wafer 72 may be dried by air or by heat without substantial damage to the resist pattern. Hexane dries more easily than a water or water-based solution, particularly when exposed to air. In addition to its lower density and lower surface tension, the easy-drying ability of hexane facilitates reduction in pattern collapse which often results from the presence of a liquid having a higher surface tension on the surface of the wafer. Liquids having higher surface tension include water and water-based solutions.

In accordance with at least one of the methodologies described herein above, FIG. 10 illustrates an apparatus 100 for rinsing a substrate/wafer 102 during development to mitigate pattern collapse. The apparatus 100 includes a bath chamber 104 in which the wafer 102 is disposed. The bath chamber 104 may be sealed to prevent undesired outflow of bath solution (not shown). The wafer 102 may include a resist having a pattern irradiated thereon. The wafer 102 may be supported by a chuck which in turn is controlled by a positioning device (not shown). The positioning device may move the wafer as necessary to carry out the present invention.

Connected to the bath chamber are two nozzles which are responsible for supplying the liquid for the bath chamber 104. Nozzle 106 may be used for a first rinsing solution such as, for example, water or a water solvent/water-based solution. However, any conventional rinsing solution may be employed. Once the conventional rinsing solution has been applied to the wafer 102, the wafer 102 may be prepared for a subsequent drying process. Nozzle 108 may be used to supply a second rinsing solution to the bath chamber 104 to facilitate preparation of the drying process. The second rinsing solution comprises a solution having a lower density and a lower surface tension than the first rinsing solution. The second rinsing solution may comprise hexane, for example, which is substantially non-destructive to the physical or chemical integrity of the wafer 102 and/or the resist pattern (not shown). The lower density and lower surface tension mitigates pattern collapse during the subsequent drying process. In particular, hexane or a hexane solution is less dense than a water or water-based solution. Likewise, hexane has a lower surface tension which means that the hexane droplets located within or among the resist pattern following the rinse process may not pull or cause the resist pattern to shift and hence collapse while the hexane evaporates from the surface.

The nozzles 106 and 108 are both operatively connected to and controlled by a control system 110. The control system 110 also controls the drain 112. The control system 110 regulates the flow rate of the first and second rinsing solutions as well as the rate at which solution is released or drained from the chamber 104. This is critical because the wafer 102 must be covered or immersed in liquid at all times during the development and rinsing phases to avoid damage to the resist pattern and to the wafer in general.

Moreover, introduction of a hexane solution into a rinsing process during development of a substrate/wafer mitigates pattern collapse, thereby facilitating increased wafer yield and overall circuit performance.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An apparatus for rinsing a substrate during a development process to mitigate pattern collapse comprises:

a bath chamber;

a substrate holder disposed in the bath chamber for holding the substrate having a resist pattern formed thereon;

a first nozzle for dispensing a first rinsing solution having a first density and first surface tension into the bath chamber;

a second nozzle for dispensing a second rinsing solution having a second density and second surface tension, which is less than the first rinsing solution, into the bath chamber;

a drain disposed in a bottom portion of the bath chamber; and a controlling system operatively coupled to the first nozzle, the second nozzle and the drain designed to regulate and coordinate the operation of the first nozzle, the second nozzle and the drain, wherein the drain removes the first rinsing solution concurrently as the second nozzle dispenses the second rinsing solution so that the substrate is immersed in liquid at substantially all times.

2. The apparatus of claim 1, wherein the substrate comprises at least a resist thereon.

3. The apparatus of claim 1, wherein the substrate holder is a chuck supported by a positioning device.

4. The apparatus of claim 1, wherein the first rinsing solution comprises water.

5. The apparatus of claim 1, wherein the second rinsing solution comprises hexane.

6. The apparatus of claim 1, wherein the controlling system is programmed to regulate and coordinate the first nozzle, the second nozzle and the drain during a development process.

7. A method for rinsing a substrate during development to mitigate pattern collapse comprises:

providing the substrate having a resist pattern irradiated thereon into a bath chamber;

exposing the substrate to a developer solution;

removing the developer solution from the chamber via a drain;

introducing a first rinsing solution into the bath chamber concurrently with removing the developer solution so that the substrate is immersed in liquid at substantially all times;

removing the first rinsing solution from the chamber via the drain;

introducing a hexane solution into the bath chamber concurrently with removing the first rinsing solution so that the substrate is immersed in liquid at substantially all times; and removing the hexane solution via the drain in order to dry the substrate.

8. The method of claim 7, wherein the bath chamber is an enclosed chamber.

9. The method of claim 7, wherein the developer solution is removed at a rate about equal to the rate the water flows into the bath chamber.

10. The method of claim 7, wherein the first rinsing solution comprises water.

11. The method of claim 10, wherein the water solution is more dense than the hexane solution thereby allowing the water solution to settle in a bottom portion of the bath chamber.

12. The method of claim 7, wherein the hexane solution substantially covers the substrate surface.

13. The method of claim 7, wherein the first rinsing solution is removed at a rate about equal to the rate the hexane solution flows into the bath chamber.

14. The method of claim 7, wherein the hexane solution comprises pure hexane.

15. A method for rinsing a substrate during development to mitigate pattern collapse comprises:

providing the substrate having a resist pattern irradiated thereon into a bath chamber;

exposing the substrate to a developer solution;

removing the developer solution from the chamber via a drain;

introducing a water solution into the bath chamber concurrently with removing the developer solution so that the substrate is immersed in liquid at substantially all times, wherein the water solution rinses the developer solution from the substrate;

removing the water solution from the chamber via the drain;

introducing a hexane solution into the bath chamber concurrently with removing the water solution so that the substrate is immersed in liquid at substantially all times, wherein the hexane solution facilitates a subsequent drying process; and removing the hexane solution via the drain in order to dry the substrate.

16. The method of claim 15, wherein the developer solution is removed at a rate about equal to the rate the water flows into the bath chamber.

17. The method of claim 15, wherein the water solution is more dense than the hexane solution thereby allowing the water solution to settle in a bottom portion of the bath chamber.

18. The method of claim 15, wherein the hexane solution substantially covers the substrate surface.

19. The method of claim 15, wherein the first rinsing solution is removed at a rate about equal to the rate the hexane solution flows into the bath chamber.

20. An apparatus for rinsing a substrate during development to mitigate pattern collapse comprises:

means for providing the substrate having a resist pattern irradiated thereon into a bath chamber;

means for exposing the substrate to a developer solution;

means for removing the developer solution from the chamber via a drain;

means for introducing a first rinsing solution into the bath chamber concurrently with removing the developer solution so that the substrate is immersed in liquid at substantially all times;

means for removing the first rinsing solution from the chamber via the drain;

means for introducing a hexane solution into the bath chamber concurrently with removing the first rinsing solution so that the substrate is immersed in liquid at substantially all times; and means for removing the hexane solution via the drain in order to dry the substrate.

* * * * *